United States Patent
Sekine et al.

(10) Patent No.: US 8,411,486 B2
(45) Date of Patent: Apr. 2, 2013

(54) NONVOLATILE MEMORY DEVICE AND METHOD OF MANUFACTURING THE SAME

(75) Inventors: Katsuyuki Sekine, Yokkaichi (JP); Ryota Fujitsuka, Yokkaichi (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 12/823,467

(22) Filed: Jun. 25, 2010

(65) Prior Publication Data

US 2011/0069530 A1 Mar. 24, 2011

(30) Foreign Application Priority Data

Sep. 18, 2009 (JP) .................................. 2009-218109

(51) Int. Cl.
*G11C 11/00* (2006.01)
(52) U.S. Cl. ........ 365/148; 365/100; 365/129; 365/158; 365/163
(58) Field of Classification Search .................... 365/46, 365/94, 100, 129, 148, 158, 163; 257/2–5, 257/9, 310, E21.35; 438/95, 96, 135, 166, 438/240, 365, 482, 486, 597, 785
See application file for complete search history.

(56) References Cited

U.S. PATENT DOCUMENTS

| | | | | |
|---|---|---|---|---|
| 7,990,753 B2 * | 8/2011 | Matsuo | .......................... | 365/148 |
| 8,068,358 B2 * | 11/2011 | Maejima | ....................... | 365/148 |
| 8,159,859 B2 * | 4/2012 | Maejima | ....................... | 365/148 |
| 2008/0258129 A1 | 10/2008 | Toda | | |
| 2010/0034012 A1 * | 2/2010 | Matsuo | ......................... | 365/148 |
| 2010/0054017 A1 * | 3/2010 | Maejima | ....................... | 365/148 |
| 2010/0232198 A1 * | 9/2010 | Maejima et al. | ................ | 365/51 |
| 2010/0232199 A1 * | 9/2010 | Maejima | ....................... | 365/51 |
| 2010/0238708 A1 * | 9/2010 | Nagashima | ................... | 365/148 |
| 2010/0322008 A1 * | 12/2010 | Yoneya et al. | ........... | 365/185.18 |

FOREIGN PATENT DOCUMENTS

JP 2008-210441 9/2008

OTHER PUBLICATIONS

U.S. Appl. No. 12/824,633, filed Jun. 28, 2010, Fujitsuka, et al.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, there is provided a method of manufacturing a nonvolatile memory device. In this method, a first voltage may be applied to a variable resistive element having a resistance value which is electrically rewritable in a high resistance and in a low resistance. In this method, a second voltage may be applied to the variable resistive element in a case where the resistance value of the variable resistive element to which the first voltage has been applied is greater than a resistance value of the low resistance and is not greater than a resistance value of the high resistance. Further, in this method, the applying of the second voltage to the variable resistive element may be repeated until the resistance value of the variable resistive element to which the second voltage has been applied falls within a range of the resistance value of the low resistance.

9 Claims, 5 Drawing Sheets

NONVOLATILE MEMORY DEVICE AND METHOD OF MANUFACTURING THE SAME

CROSS-REFERENCE TO RELATED APPLICATION

This application is based upon and claims the benefit of priority from Japanese Patent Application No. 2009-218109, filed Sep. 18, 2009; the entire contents of which are incorporated herein by reference.

FIELD

Embodiments described herein relate generally to a nonvolatile memory device and a method of manufacturing the same.

BACKGROUND

In recent years, memories of the next generation, such as a ferroelectric random access memory (FeRAM), a magnetic random access memory (MRAM) and a resistance random access memory (ReRAM), have been proposed. In particular, a ReRAM, which includes a plurality of memory cell arrays stacked on a substrate in a three-dimensional structure, has been proposed (see, e.g. US2008/0258129). According to this ReRAM, the chip area can greatly be reduced.

In the above-described ReRAM, a transition metal oxide is used, in some cases, as the material of memory cells. In order to set the transition metal oxide in a resistance-variable state, it is necessary to perform a forming operation which is an initializing operation. However, if the forming operation is performed only once, the resistances of the memory cells in the memory cell arrays are not made uniform in the same state. To address this problem, for example, a method has been thought of performing the forming operation more than once, thereby gradually setting the resistances of memory cells of the memory cell arrays in a low resistance state and a high resistance state. However, the voltage for the forming is high, and if the forming is performed many times, the memory cell array may possibly be destroyed. In addition, even if the forming is performed, it is possible that the memory cells are not set in the state (proper resistance state) in which the memory cells can surely perform operations. Thus, in the conventional forming method, it is difficult to form a ReRAM using a transition metal oxide, which can perform a highly reliable memory operation with high quality.

DETAILED DESCRIPTION

In general, according to one embodiment, there is provided a method of manufacturing a nonvolatile memory device. In this method, a first voltage may be applied to a variable resistive element having a resistance value which is electrically rewritable in a high resistance state and in a low resistance state. In this method, the resistance value of the variable resistive element to which the first voltage has been applied may be measured. In this method, a second voltage may be applied to the variable resistive element in a case where the measured resistance value is greater than a resistance value of the low resistance state and is not greater than a resistance value of the high resistance state. In this method, the resistance value of the variable resistive element to which the second voltage has been applied may be measured. Further, in this method, the applying of the second voltage to the variable resistive element and the measuring of the resistance value of the variable resistive element may be repeated until the measured resistance value falls within a range of the resistance value of the low resistance state.

The details of the embodiment will now be described with reference to the accompanying drawings.

EMBODIMENT

A description is given of a forming method of a variable resistive element of a nonvolatile memory device (resistance change type memory device) according to the embodiment.

To begin with, referring to FIG. 1 to FIG. 5, the basic structure of the nonvolatile memory device according to the embodiment is described.

Figure 1:
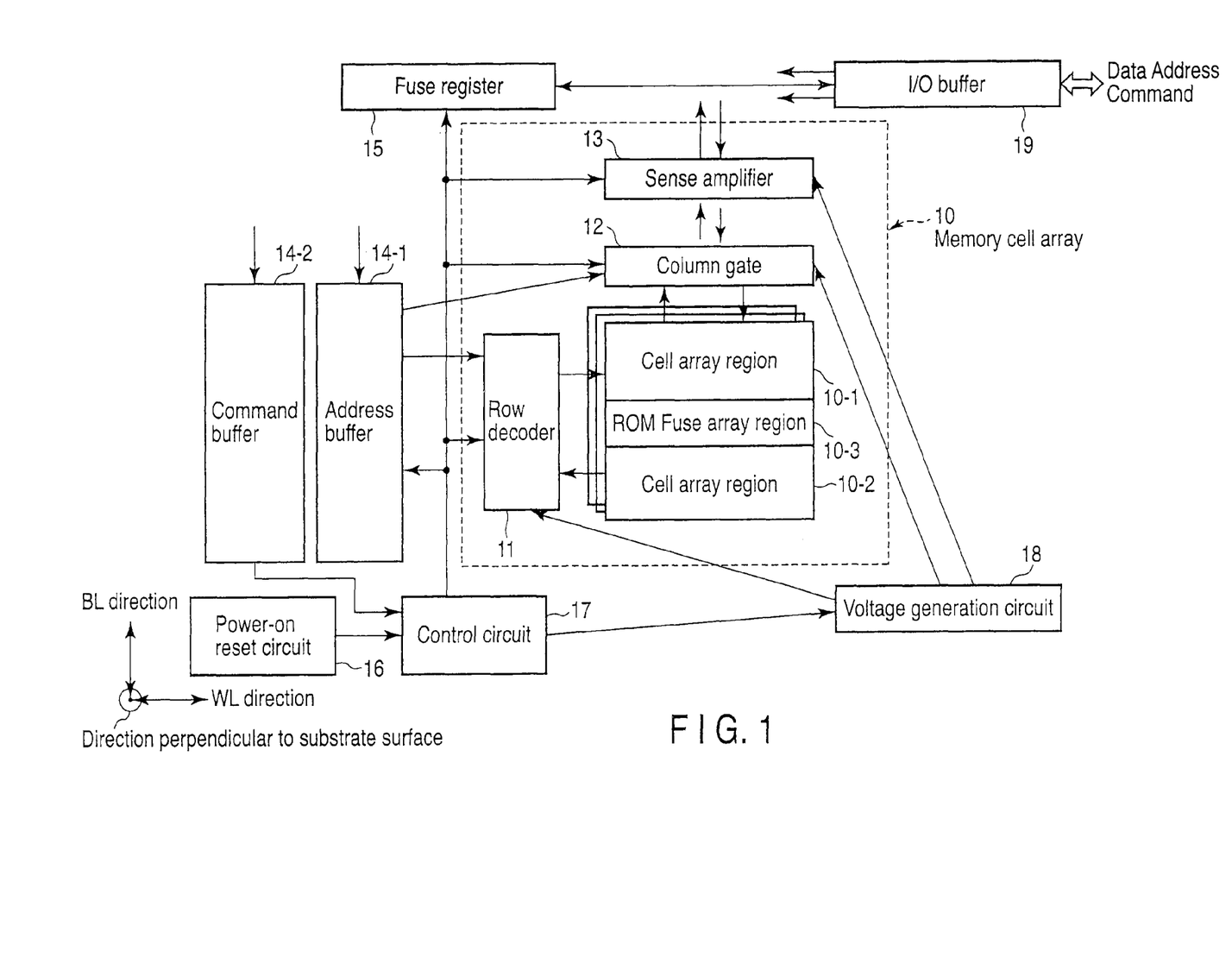
FIG. 1 schematically shows the entire structure of a resistance change type memory device according to an embodiment.

As shown in FIG. 1, the nonvolatile memory device according to an example comprises a memory cell array 10, an address buffer 14-1, a command buffer 14-2, a fuse register 15, a power-on reset circuit 16, a control circuit 17, a voltage generation circuit 18, and an input/output buffer 19.

The memory cell array 10 comprises cell array regions 10-1 and 10-2 each including a plurality of ReRAM memory cells which are arrayed in a matrix at intersections between a plurality of word lines (WL) and a plurality of bit lines (BL) and are random-accessed; a ROM fuse array region 10-3; a row decoder 11; a column gate 12; and a sense amplifier 13. The cell array region 10-1, 10-2, has a three-dimensional structure in which a plurality of cell arrays are stacked in a direction perpendicular to the substrate surface of the semiconductor substrate, as will be described later.

The row decoder 11 decodes addresses in a row direction (word line direction). The row decoder 11 includes a driving circuit which drives word lines.

The column gate 12 selects bit lines in accordance with addresses in a column direction (bit line direction). Although not shown, in the example, the column gate 12 is disposed on each of an upper side and a lower side of the memory cell array 10, as will be described below.

The sense amplifier 13 is electrically connected to the column gate 12 and bit lines, and reads out the data of the memory cells. Although not shown, in the example, the sense amplifier 13 is disposed on each of the upper side and lower side of the memory cell array 10. In addition, there are sense amplifiers 13, the number of which corresponds to a plural number of times of the bit number of I/O pins 0 to 7, which will be described later.

The input/output buffer 19 is connected to the sense amplifier 13, fuse register 15, address buffer 14-1 and command buffer 14-2, and temporarily holds data, addresses and commands from the outside of a host device, etc.

The address buffer 14-1 is electrically connected to the row decoder 11 and column decoder 12, and temporarily holds row addresses and column addresses which are delivered from the input/output buffer 19.

The command buffer 14-2 is electrically connected to the control circuit 17, and temporarily holds control commands which are delivered from the input/output buffer 19.

The fuse register 15 is electrically connected to the input/output buffer 19 via a data bus, and stores necessary data, such as management data.

The power-on reset circuit 16 detects power-on of this nonvolatile memory device, and outputs a reset signal to the control circuit 17.

The voltage generation circuit 18 is electrically connected to the row decoder 11, column decoder 12 and sense amplifier 13, and supplies voltages necessary for these circuit components under the control of the control circuit 19.

The control circuit 17 controls the fuse register 15 in accordance with a reset signal of the power-on reset circuit 16. Further, based on commands delivered from the command buffer 14-2, the control circuit 17 controls the address buffer 14-1, row decoder 11, column gate 12, sense amplifier 13 and voltage generation circuit 18, thereby executing data write, data read and data erase.

Figure 2:
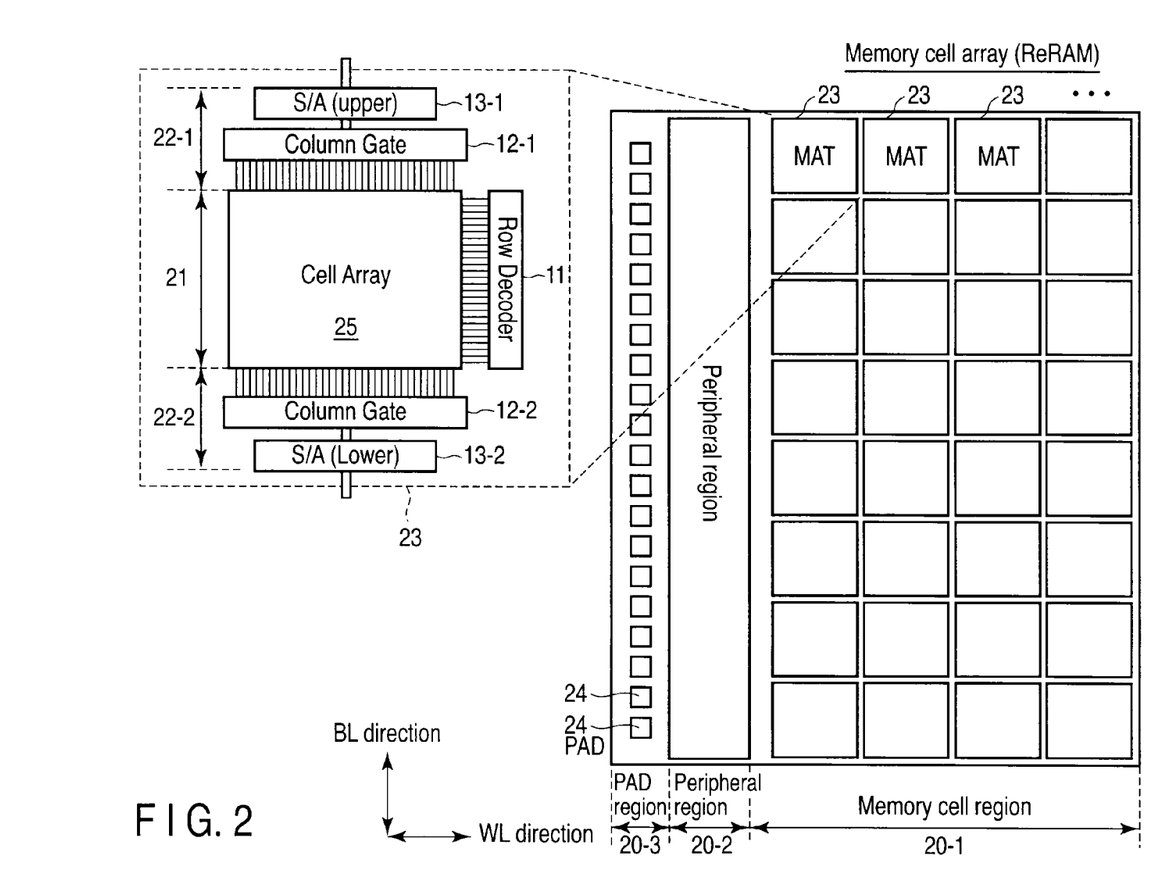
FIG. 2 schematically shows the basic structure of the resistance change type memory device according to the embodiment.

FIG. 2 schematically shows another example of the basic structure of the nonvolatile memory device according to the embodiment. In this example, in order to avoid concentration of current in the memory cell array, the memory cell array is divided into a plurality of mats MAT.

As shown in FIG. 2, the memory cell array 10 comprises a memory cell region 20-1, a peripheral region 20-2 and a pad (PAD) region 20-3. The memory cell region 20-1 includes a plurality of mat (MAT) regions 23. A plurality of pads (PAD) 24 are disposed in the pad region 20-3.

Each of the mats (MAT) 23 includes a cell array region 21 and cell array peripheral regions 22-1 and 22-2. Specifically, each mat 23 includes a cell array 25, column gates 12-1 and 12-2, sense amplifiers 13-1 and 13-2, and a row decoder 11. The cell array 25 includes a plurality of memory cells which are disposed in the cell array region 21, are disposed in a matrix at intersections between a plurality of word lines and a plurality of bit lines, and are random-accessed. The column gate 12-1 is disposed on the upper surface of the cell array 25 in the cell array peripheral region 22-1. The column gate 12-2 is disposed on the lower surface of the cell array 25 in the cell array peripheral region 22-2. The sense amplifier 13-1 is disposed on the upper surface of the column gate 12-1 in the cell array peripheral region 22-1. The sense amplifier 13-2 is disposed on the lower surface of the column gate 12-2 in the cell array peripheral region 22-2. In addition, the row decoder 11 is disposed on the lateral side of the cell array 25 in the cell array peripheral region 22-1.

The pads 24 include, for instance, I/O pads 0 to 7 to which addresses and commands are input, and control pads such as CE pads, to which chip enable signals are input.

A lead-out region (not shown) is provided around the cell array 25.

Figure 3:
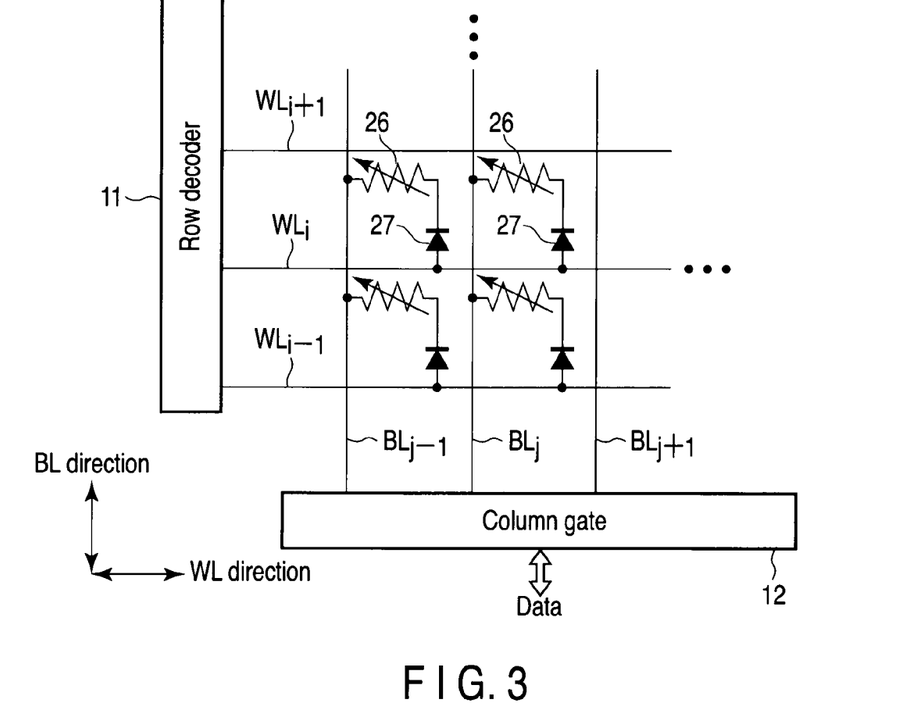
FIG. 3 schematically shows the basic circuit structure of a cell array in the embodiment.

Next, referring to FIG. 3, a description is given of the basic circuit structure of the cell array region, etc. in the embodiment, and the example of the operation thereof.

FIG. 3 schematically shows the basic circuit structure of the cell array region, etc. shown in FIG. 1 and FIG. 2.

As shown in FIG. 3, the cell array includes a plurality of memory cells which are disposed in a matrix at intersections of between a plurality of bit lines $BL_{j-1}$ to $BL_{j+1}$ and a plurality of word lines $WL_{i-1}$ to $WL_{i+1}$, and are random-accessed. Each of the memory cells includes a variable resistive element 26 and a diode 27 (non-ohmic element) 27 which are connected in series. One end of the variable resistive element 26 is connected to the bit line, $BL_{j-1}$ to $BL_{j+1}$, and the other end thereof is connected to the cathode of the diode 27. The anode of the diode 27 is connected to the word line, $WL_{i-1}$ to $WL_{i+1}$.

One end of the bit line, $BL_{j-1}$ to $BL_{j+1}$, is electrically connected to the column gate 12. One end of the word line, $WL_{i-1}$ to $WL_{i+1}$, is connected to the row decoder 11.

Next, the outline of the data write operation of the memory cell is described.

In order to write data, a voltage is applied to the variable resistive element 26 which is selected, so that a potential gradient may occur in the selected variable resistive element 26, thus causing current to flow. For example, a state is created in which the potential of the word line $WL_i$ is relatively higher than the potential of the bit line $BL_j$. Specifically, when the potential of the word line $WL_i$ is a fixed potential of, e.g. about 3 V, a ground potential is supplied to the bit line $BL_j$.

At the time of the data write operation, it is preferable to bias all the non-selected word lines $WL_{i-1}$ and $WL_{i+1}$ and bit lines $BL_{j-1}$ and $BL_{j+1}$ to the same potential. In addition, at a standby time prior to the data write operation, it is preferable to precharge all word lines $WL_{i-1}$, $WL_i$ and $WL_{i+1}$ and all bit lines $BL_{j-1}$, $BL_j$ and $BL_{j+1}$.

Next, the outline of the data read operation of the variable resistive element 26 is described.

The data read operation is performed, for example, by applying a voltage pulse to the selected variable resistive element 26 and detecting a current which is determined by the resistance of the variable resistive element 26. It is desirable that the voltage pulse be a voltage pulse with such a small amplitude as not to cause a state change of the material of the variable resistive element 26.

For example, the read operation is performed by applying a read voltage to the selected memory cell from the bit line $BL_j$, and measuring the value of current at this time by the sense amplifier.

Next, the outline of the data erase and write operations of the variable resistive element 26 is described.

An erase voltage pulse is applied to the variable resistive element 26 in a high resistance state (HRS) that is a write state. Thereby, the variable resistive element 26 can be transitioned to a low resistance state (LRS) that is an erase state. This transition of the resistance of the variable resistive element 26 from the high resistance state (HRS) to the low resistance state (LRS) is referred to as "data erase".

By applying a write voltage pulse to the variable resistive element 26 in the low resistance state (LRS) that is the erase state, the variable resistive element 26 can be transitioned to the high resistance state (HRS) that is the write state. This transition of the resistance of the variable resistive element 26 from the low resistance state (LRS) to the high resistance state (HRS) is referred to as "data write".

In the present embodiment, data is recorded with two values, by setting the erase state (e.g. "1") in the case where the resistance of the variable resistive element 26 is in the low resistance state (LRS) and setting the write state (e.g. "0") in the case where the resistance of the variable resistive element 26 is in the high resistance state (HRS). In addition, the resistance of the variable resistive element 26 in the low resistance state (LRS) is Ron, and the resistance of the variable resistive element 26 in the high resistance state (HRS) is Roff. The magnitude of Roff is three times or greater than that of Ron.

Figure 4:
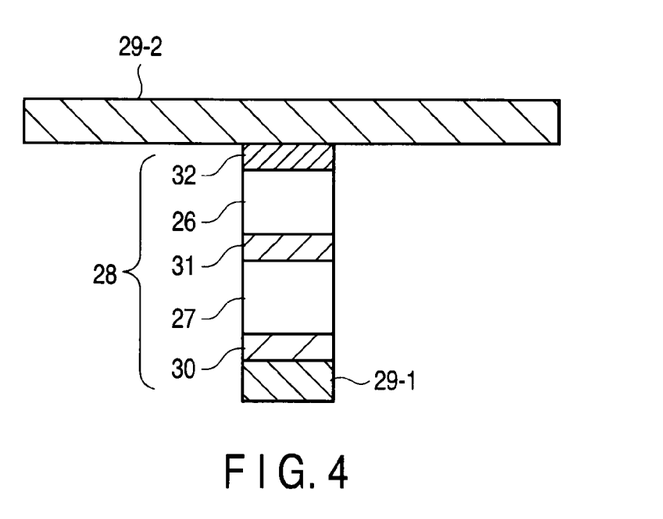
FIG. 4 is a cross-sectional view which schematically shows the basic structure of a memory cell structure in the embodiment.

Next, referring to FIG. 4, a description is given of a structure example of the memory cell structure according to the embodiment.

FIG. 4 is a cross-sectional view which schematically shows the basic structure of the memory cell structure including the memory cell according to the embodiment.

As shown in FIG. 4, a memory cell structure 28, in which the variable resistive element 26 functioning as a memory layer (resistance change layer) and the diode 27 are stacked, is formed between, for example, a bit line 29-1 ($BL_j$) and a word line 29-2 ($WL_i$). To be more specific, the memory cell structure 28 has a pillar shape and comprises a barrier metal layer (adhesive layer) 30 formed on the bit line 29-1, the non-ohmic element (diode) 27 formed on the barrier metal layer 30, a lower electrode 31 formed on the diode 27, the variable resistive element 26 formed on the lower electrode 31, and an upper electrode (buffer layer) 32 formed between the variable resistive element 26 and the word line 29-2.

A heat-resistant material with low electrical resistance is mainly used as the material of the bit line 29-1 and word line 29-2. Examples of the wiring material include W, WSi, NiSi, and CoSi.

The barrier metal layer 30 is formed of, for instance, Ti or TiN.

The non-ohmic element 27 is formed of, for instance, a PIN diode comprising a p-type silicon layer/i-type silicon layer/n-type silicon layer. However, aside from the PIN diode, use may be made of various diodes such as a PN junction diode and a Schottky diode, a metal-insulator-metal (MIM) structure, and a silicon-insulator-silicon (SIS) structure.

The lower electrode 31 and upper electrode 32 are formed of, for instance, Pt, Au, Ag, TiAlN, SrRuO, Ru, RuN, Ir, Co, Ti, TiN, TaN, LaNiO, Al, PtIrOx, PtRhOx, Rh, or TaAlN.

The variable resistive element 26 is formed of, for instance, a transition metal oxide such as hafnia, zirconia, nickel oxide, manganese oxide, titania or tantalum oxide, or metal oxides which are obtained by doping these materials with proper additives.

The positions of the variable resistive element 26 and diode 27 may be transposed.

A contact layer may be formed between the upper electrode 32 and word line 29-2.

Figure 5:
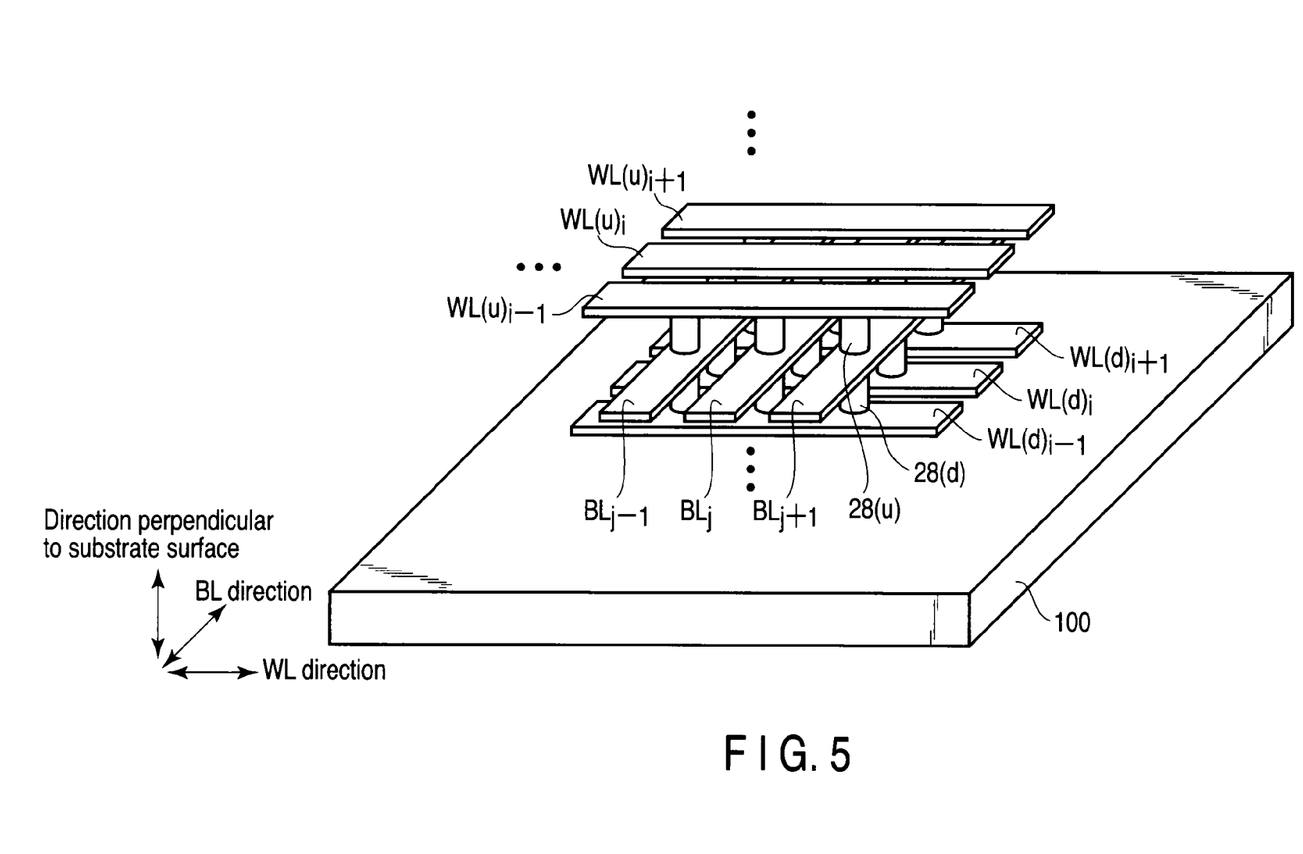
FIG. 5 is a perspective view which schematically shows the basic structure of the cell array in the embodiment.

Next, referring to FIG. 5, a three-dimensional structure example of the cell array according to the embodiment is schematically described.

The cell array of this embodiment has a cross-point structure. The cross-point structure refers to a structure in which cell structures are formed at intersections between a plurality of parallel wiring lines and a plurality of other parallel wiring lines crossing them three-dimensionally. In this embodiment, a plurality of these structures are stacked.

As shown in FIG. 5, plural memory cell structures 28 are stacked in a direction perpendicular to the substrate surface of a semiconductor substrate 100. To be more specific, an insulation layer (not shown) is formed on the semiconductor substrate 100, and word lines ($WL_{i-1}(d)$, $WL_i(d)$, $WL_{i+1}(d)$) are formed on the insulation layer. Bit lines ($BL_{j-1}$, $BL_j$, $BL_{j+1}$) are formed above the word lines ($WL_{i-1}(d)$, $WL_i(d)$, $WL_{i+1}(d)$) such that the bit lines extend at right angles with the word lines. Memory cell structures 28(d) are interposed at intersections between the word lines ($WL_{i-1}(d)$, $WL_i(d)$, $WL_{i+1}(d)$) and the bit lines ($BL_{j-1}$, $BL_j$, $BL_{j+1}$). Further, word lines ($WL_{i-1}(u)$, $WL_i(u)$, $WL_{i+1}(u)$) are formed above the bit lines ($BL_{j-1}$, $BL_j$, $BL_{j+1}$) such that these word lines extend at right angles with the bit lines. Memory cell structures 28(u) of a second layer are interposed at intersections between the word lines ($WL_{i-1}(u)$, $WL_i(u)$, $WL_{i+1}(u)$) and the bit lines ($BL_{j-1}$, $BL_j$, $BL_{j+1}$). Although the memory cell structures 28 are stacked in two layers in FIG. 5, the memory cell structures 28 may be stacked in three layers, four layers, etc.

Although not shown, select transistors for selecting plural cell arrays, resistor elements, etc. are formed under the memory cells (memory cell structures 28(d), memory cell structures 28(u), . . . ) in the surface region of the semiconductor substrate 100.

Figure 6:
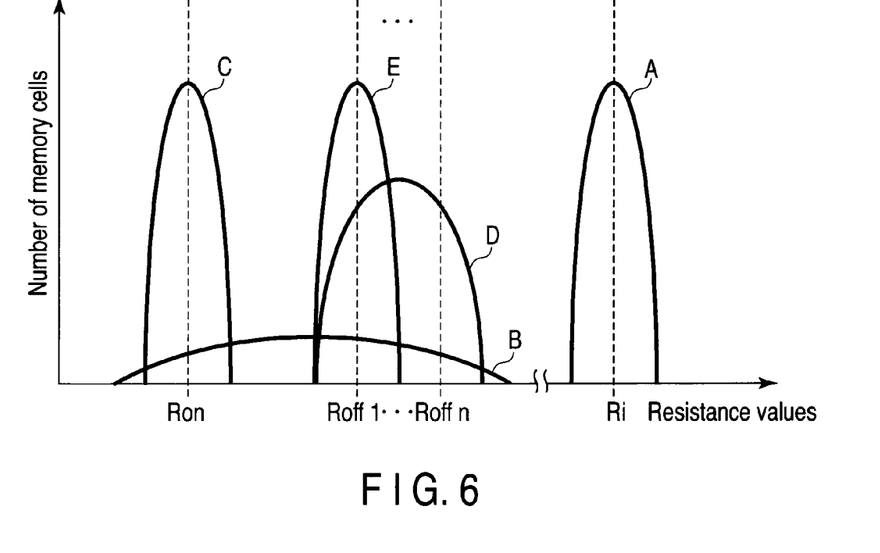
FIG. 6 is a graph which schematically shows the relationship between the number of memory cells and the resistance values of the memory cells.
Figure 7:
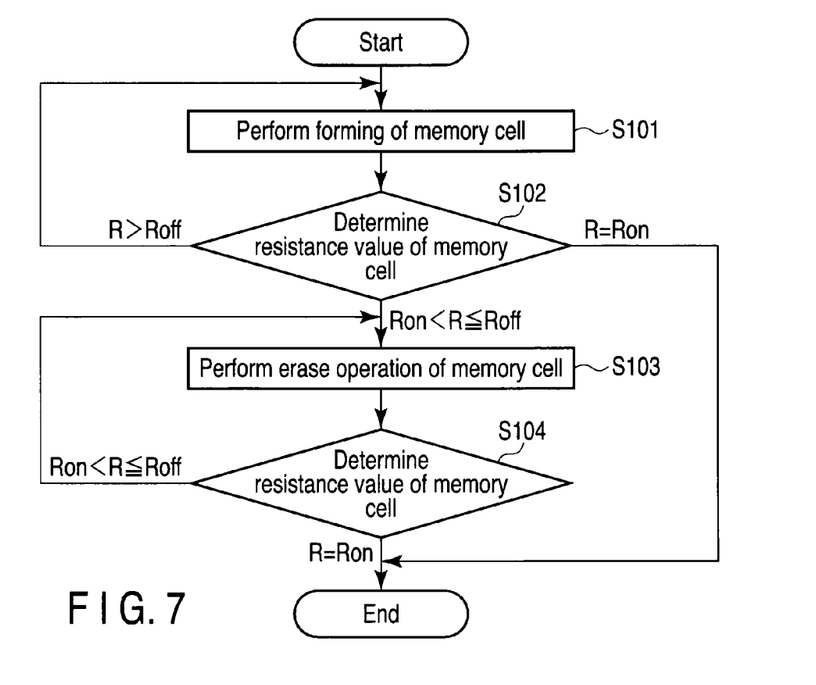
FIG. 7 is a flow chart illustrating a forming method of a nonvolatile memory device according to the embodiment.

Next, referring to FIG. 3, FIG. 6 and FIG. 7, a description is given of a forming method that is the method of initializing the nonvolatile memory device of the embodiment. FIG. 6 is a graph which schematically shows the relationship between the number of memory cells and the resistance values of the memory cells. The abscissa indicates the resistance values of memory cells, and the ordinate indicates the number of memory cells.

The memory cell is a nonvolatile memory cell which records a resistance value as data. In particular, in the case where a metal oxide is used as a memory layer of the memory cell, it is necessary to perform a memory initializing operation, which is called "forming", on the metal oxide. By performing the forming, the metal oxide becomes a variable resistive element in which the resistance varies, and data write and data read are enabled.

As shown in FIG. 6, the resistance values of the memory cells before the forming are, e.g. Ri, and resistance values are distributed as indicated by A. The resistance values of memory cells after the forming are not fixed, and are distributed as indicated by B. In the meantime, when the memory cell is in the erase state, the resistance value is Ron, and the resistance values are distributed as indicated by C. In addition, since there are a plurality of resistance values Roff1 to Roffn (n: an integer) in the write state, the resistance values are distributed as indicated by D when the memory cells are in the write state. As indicated by E, in the case where memory cells are to be distributed in a manner to concentrate at the resistance value Roff1, a write pulse is applied after the resistance value is once set at Ron of the erase state. Compared to the degree of variance of C, the degree of variance of D is 5 times to 100 times greater.

In the forming in the present embodiment, the resistance values of memory cells after the forming are uniformly set at Ron with less variance, which is used at the time of operations.

Next, referring to FIG. 7, a description is given of the forming method of the nonvolatile memory device of the embodiment.

[Step S101]

In the cell array of FIG. 3, for example, the bit line $BL_j$ and word line $WL_i$ are selected, and the forming is performed on the variable resistive element 26 of the memory cell at the intersection between the bit line $BL_j$ and word line $WL_i$. Specifically, the voltage of the selected bit line $BL_j$ is kept at, e.g. Vss, and a forming voltage pulse Vf is applied to the selected word line $WL_i$. At the same time, the voltage of the non-selected word lines $WL_{i-1}$ and $WL_{i+1}$ is set at Vss, and a forming-prevention voltage pulse Vf is applied to the non-selected bit line $BL_{j-1}$ and bit line $BL_{j+1}$. The forming voltage pulse Vf, for example, has a pulse width of 10 μsec or less, and has a voltage of 4 to 10 V.

[Step S102]

After the forming is performed on the variable resistive element 26 which is selected by the bit line $BL_j$ and word line $WL_i$, the resistance of the variable resistive element 26 is read. For example, current is read by applying a read voltage, with which the rectifying element (diode) 27 connected to the variable resistive element 26 is set in a forward bias state, to the word line $WL_i$ and bit line $BL_j$.

If the read resistance value of the variable resistive element 26 is within the range of the resistance value (Ron) of the low resistance state (LRS), the forming of the variable resistive element 26 is finished, and another variable resistive element 26 is selected and step S101 is executed.

In the case where the read resistance value of the variable resistive element 26 is greater than the resistance value (Roff) of the high resistance state (HRS), the process returns to step S101 and the forming is performed once again on the variable resistive element 26.

In the above-described forming method, the forming pulse of the same voltage may be applied a plural number of times, or the voltage may gradually be increased or the pulse width may be increased as the number of times of forming increases. To raise the voltage or increase the pulse width is preferable since the forming operation can be finished with a less number of times.

If the read resistance value of the variable resistive element 26 is greater than the resistance value (Ron) of the low resistance state (LRS) and is not greater than the resistance value (Roff) of the high resistance state (HRS), the process goes to step S103.

In step S102, in the case where, even if the forming is performed a predetermined number of times, the resistance value of the variable resistive element 26 is greater than the resistance value (Ron) of the low resistance state (LRS), does not fall within the range of not greater than the resistance value (Roff) of the high resistance state (HRS) and is greater than the resistance value (Roff) of the high resistance state (HRS), the erase operation of the variable resistive element 26 in step S103 is stopped. This variable resistive element 26 is set to be a non-usable bad cell, the position thereof is recorded, and this variable resistive element 26 is not used in subsequent operations. Then, the forming of the variable resistive element 26 is finished, and another variable resistive element 26 is selected and step S101 is executed.

[Step S103]

An erase operation is performed on the variable resistive element 26. Specifically, the bit line $BL_j$ is kept at Vss, for example, and an erase voltage pulse Ve, which is different from the forming voltage pulse Vf, is applied to the word line $WL_i$. At the same time, the voltage of the non-selected word lines $WL_{i-1}$ and $WL_{i+1}$ is set at Vss, and an erroneous erase prevention voltage pulse Ve is applied to the non-selected bit lines $BL_{j-1}$ and $BL_{j+1}$. It is preferable to satisfy the relationship, i.e. the forming voltage pulse Vf> the erase voltage pulse Ve, and the erase voltage pulse Ve, for example, has a pulse width of 10 μsec or less and a voltage of 2 to 5 V.

[Step S104]

Like step S102, the resistance of the variable resistive element 26 is read. If the read resistance value of the variable resistive element 26 falls within the range of the resistance value (Ron) of the low resistance state (LRS), the erase operation of the variable resistive element 26 is finished, and another variable resistive element 26 is selected and step S101 is executed.

If the read resistance value of the variable resistive element 26 is greater than the resistance value (Ron) of the low resistance state (LRS) and is not greater than the resistance value (Roff) of the high resistance state (HRS), the process returns to step S103 to perform the erase operation on the variable resistive element 26 once again.

In the above-described erase method, the erase voltage pulse of the same voltage may be applied a plural number of times, or the voltage may gradually be increased or the pulse width may be increased as the number of times of erase increases. To raise the voltage or increase the pulse width is preferable since the erase operation can be finished with a less number of times.

In step S104, in the case where, even if the erase operation is performed a predetermined number of times, the resistance value of the variable resistive element 26 does not fall within the range of the resistance value (Ron) of the low resistance state (LRS), the erase operation of the variable resistive element 26 is stopped. This variable resistive element 26 is set to be a non-usable bad cell, the position thereof is recorded, and this variable resistive element 26 is not used in subsequent operations. Then, the erase operation of the variable resistive element 26 is finished, and another variable resistive element 26 is selected and step S101 is executed.

The above-described steps (initializing method) are executed on all variable resistive elements 26 within the cell array.

According to the above-described embodiment, the resistance value of the variable resistance element 26 is determined after the forming that is the initializing step of the variable resistive element 26. Based on the determination result, the predetermined voltage pulse is repeatedly applied to the variable resistive element 26 and the measurement of the resistance value is repeated until the resistance value of the variable resistance element 26 comes to the resistance vale (Ron) of the low resistance state (LRS). Therefore, the resistances of the variable resistive elements 26 within the cell array after the forming can exactly be made uniform at the resistance value (Ron) of the low resistance state (LRS).

As regards the transition metal oxide that is used as the variable resistive element 26, the erase voltage is higher than the write voltage, and there are plural resistance values Roff1 to Roffn of the write state. Thus, the variance between resistance values becomes smaller if the resistances of the variable resistive elements 26 in the cell array are made uniform at the resistance value (Ron) of the low resistance state (LRS).

In this manner, in the above-described embodiment, the resistance values after the forming of the variable resistive elements 26 are measured one by one, and the voltage is applied in accordance with the measured resistance value. Thus, the number of times of application of the voltage to the variable resistive elements 26 can be made smaller. In other words, with a smaller number of times of voltage application, the variable resistive elements 26 can be set in a state in which stable operations can be performed. Therefore, the reliability of the nonvolatile memory device can be improved. By uniformly setting the resistance values of the variable resistive elements 26 at the resistance value (Ron) of the low resistance state (LRS), a high-quality nonvolatile memory device, which can stably operate without execution of an initializing operation can be formed.

Moreover, by using the above-described forming method, the forming is performed to uniformly set the respective memory cells at the resistance value (Ron) of the low resistance state (LRS) that is the erase state. Thereafter, the write pulse is applied to the selected memory cell, and the memory cell is set in the write state. Thereby, at least one of the voltage of the write pulse, the time of the write pulse and the number of times of pulse application can be varied. As a result, the resistance value (Roff) of the high resistance state (HRS) after write can be adjusted at the predetermined resistance value (Roffn).

Besides, multiple values can be recorded in one memory cell by making use of the difference between the resistance values (Roff1 to Roffn) of the high resistance state (HRS).

In the above-described example, the forming is performed on the memory cells one by one. Alternatively, the forming may be performed batchwise in units of a word line, or in units of a bit line, or in units of the cell array 25. If the number of cells, on which forming can be performed at a time, is large, the time necessary for the forming can advantageously be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
   a first wiring line;
   a second wiring line disposed to cross the first wiring line;
   a variable resistive element having a resistance value, which is electrically rewritable in a high resistance state and in a low resistance state, and a non-ohmic element, the variable resistive element and the non-ohmic element being disposed at an intersection between the first wiring line and the second wiring line; and
   a control circuit configured to apply a first voltage to the variable resistive element, to apply a second voltage to the variable resistive element in a case where the resistance value of the variable resistive element, to which the first voltage has been applied, is greater than a resistance value of the low resistance state and is not greater than a resistance value of the high resistance state, and to repeat the applying of the second voltage to the variable resistive element until the resistance value of the variable resistive element, to which the second voltage has been applied, falls within a range of the resistance value of the low resistance state.

2. The device of claim 1, wherein the control circuit is configured to apply once again the first voltage to the variable resistive element in a case where the resistance value of the variable resistive element, to which the first voltage has been applied, is measured to be greater than the resistance value of the high resistance state.

3. The device of claim 2, wherein the first voltage, which is applied once again to the variable resistive element, has a voltage value increased.

4. The device of claim 2, wherein the first voltage, which is applied once again to the variable resistive element, has a voltage pulse width increased.

5. The device of claim 1, wherein the control circuit is configured not to apply the second voltage to the variable resistive element in a case where the resistance value of the variable resistive element, to which the first voltage has been applied, is determined to fall within the range of the resistance value of the low resistance state.

6. The device of claim 1, wherein the first voltage is higher than the second voltage.

7. The device of claim 1, wherein the variable resistive element is formed of a metal oxide.

8. The device of claim 1, wherein the applying of the second voltage to the variable resistive element is repeated while a voltage value of the second voltage is being increased.

9. The device of claim 1, wherein the applying of the second voltage to the variable resistive element is repeated while a voltage pulse width of the second voltage is being increased.

* * * * *